US012733260B2

(12) United States Patent
Li et al.

(10) Patent No.: US 12,733,260 B2
(45) Date of Patent: Sep. 8, 2026

(54) DISPLAY APPARATUS

(71) Applicant: AUO Corporation, Hsinchu (TW)

(72) Inventors: Mei-Yi Li, Hsinchu (TW); Yu-Chieh Kuo, Hsinchu (TW); Yu-Hsun Chiu, Hsinchu (TW); Bo-Ru Jian, Hsinchu (TW); Wan I Shen, Hsinchu (TW); Chao-Kun Huang, Hsinchu (TW); Che-Wei Tung, Hsinchu (TW); Che-Chia Chang, Hsinchu (TW)

(73) Assignee: AUO Corporation, Hsinchu City (TW)

( * ) Notice: Subject to any disclaimer, the term of this patent is extended or adjusted under 35 U.S.C. 154(b) by 450 days.

(21) Appl. No.: 18/346,885

(22) Filed: Jul. 5, 2023

(65) Prior Publication Data

US 2024/0274614 A1 Aug. 15, 2024

(30) Foreign Application Priority Data

Feb. 14, 2023 (TW) ................................ 112105170

(51) Int. Cl.
*H10D 86/60* (2025.01)
*H10D 86/40* (2025.01)
*H10W 90/00* (2026.01)

(52) U.S. Cl.
CPC ........... *H10D 86/60* (2025.01); *H10D 86/441* (2025.01); *H10W 90/00* (2026.01)

(58) Field of Classification Search
CPC ..... H10D 86/60; H10D 86/441; H01L 25/167
See application file for complete search history.

(56) References Cited

U.S. PATENT DOCUMENTS 10,133,434 B2 11/2018 Noguchi
12,133,924 B2 * 11/2024 Cheng .................. A61K 9/5123
2017/0262093 A1 9/2017 Noguchi
2020/0301477 A1 * 9/2020 Bouthinon ......... G06V 40/1318
2022/0085099 A1 3/2022 Son et al.
2024/0046861 A1 2/2024 Wang
2024/0049529 A1 2/2024 Yang

FOREIGN PATENT DOCUMENTS

CN 107179848 9/2017
CN 112114701 12/2020
CN 112289810 1/2021
CN 113593478 11/2021
CN 113745253 12/2021
CN 113994414 1/2022

* cited by examiner

*Primary Examiner* — Ori Nadav
(74) *Attorney, Agent, or Firm* — JCIPRNET

(57) ABSTRACT

A display apparatus includes a substrate, a pixel structure, a back side signal line, and a conductive shielding layer. The substrate has a first surface and a second surface opposite to each other. The pixel structure is disposed on the first surface of the substrate. The back side signal line is disposed on the second surface of the substrate and is electrically connected to the pixel structure. The conductive shielding layer is disposed between the pixel structure and the first surface of the substrate, and the conductive shielding layer has a DC level. Moreover, other display apparatuses are also provided.

15 Claims, 9 Drawing Sheets

10D 240 210 190 170 150 130 112 110 116 114

LED 220 182 T(SPC) 160 200 184 140 220

230 260 120D 250

210 190 170 150 130 112 110 114

DISPLAY APPARATUS

CROSS-REFERENCE TO RELATED APPLICATION

This application claims the priority benefit of Taiwan application serial no. 112105170, filed on Feb. 14, 2023. The entirety of the above-mentioned patent application is hereby incorporated by reference herein and made a part of this specification.

BACKGROUND

Technical Field

The disclosure relates to an optoelectronic device, and in particular, to a display apparatus.

Description of Related Art

The LED (LED) display panel includes a substrate, a pixel driving circuit disposed on the front side of the substrate, and a micro LED electrically connected to the pixel driving circuit. Inheriting the characteristics of LEDs, an LED display panel has advantages such as low power consumption, high efficiency, high brightness, and fast response time. In addition, compared to organic LED display panels, an LED display panel also has advantages such as long luminous life and no image burn-in. Therefore, LED display panels are regarded as the next generation display technology.

Multiple LED display panels may be spliced to form a large spliced display. In order to realize a seamless spliced display, multiple LED display panels used for splicing must have ultra-narrow borders or even no borders. Therefore, part of the wirings must be disposed on the back side of the substrate of the LED display panel. However, the pixel driving circuit disposed on the front side of the substrate and the backside wiring disposed on the back side of the substrate may produce an electrical coupling effect, which will affect the operation of the pixel driving circuit, and the display defects (pattern mura) corresponding to the backside wiring may be visible from the front side.

SUMMARY

The disclosure provides a display apparatus with a good display effect.

The disclosure provides another display apparatus with a good display effect.

The disclosure provides yet another display apparatus with a good display effect.

The disclosure provides still another display apparatus with a good display effect.

A display apparatus according to an embodiment of the disclosure includes a substrate, a pixel structure, a back side signal line, and a conductive shielding layer. The substrate has a first surface and a second surface opposite to each other. The pixel structure is disposed on the first surface of the substrate. The back side signal line is disposed on the second surface of the substrate and is electrically connected to the pixel structure. The conductive shielding layer is disposed between the pixel structure and the first surface of the substrate and has a DC level.

A display apparatus according to another embodiment of the disclosure includes a substrate, a pixel structure, a back side signal line, and a conductive shielding layer. The substrate has a first surface and a second surface opposite to each other. The pixel structure is disposed on the first surface of the substrate. The back side signal line is disposed on the second surface of the substrate and is electrically connected to the pixel structure. The conductive shielding layer is disposed between the second surface of the substrate and the back side signal line and has a DC level.

A display apparatus according to yet another embodiment of the disclosure includes a substrate, a pixel structure, and a back side signal line. The substrate has a first surface and a second surface opposite to each other. The pixel structure is disposed on the first surface of the substrate. The back side signal line is disposed on the second surface of the substrate and is electrically connected to the pixel structure. In the top view of the display apparatus, there are gaps between multiple pixel structures, and the back side signal line overlaps the gaps between the multiple pixel structures and is staggered from the multiple pixel structures.

A display apparatus according to still another embodiment of the disclosure includes a substrate, a pixel structure, and a back side signal line. The substrate has a first surface and a second surface opposite to each other. The pixel structure is disposed on the first surface of the substrate. The back side signal line is disposed on the second surface of the substrate and is electrically connected to the pixel structure. All the back side signal lines located on the second surface of the substrate have a DC level.

DESCRIPTION OF THE EMBODIMENTS

Figure 1:
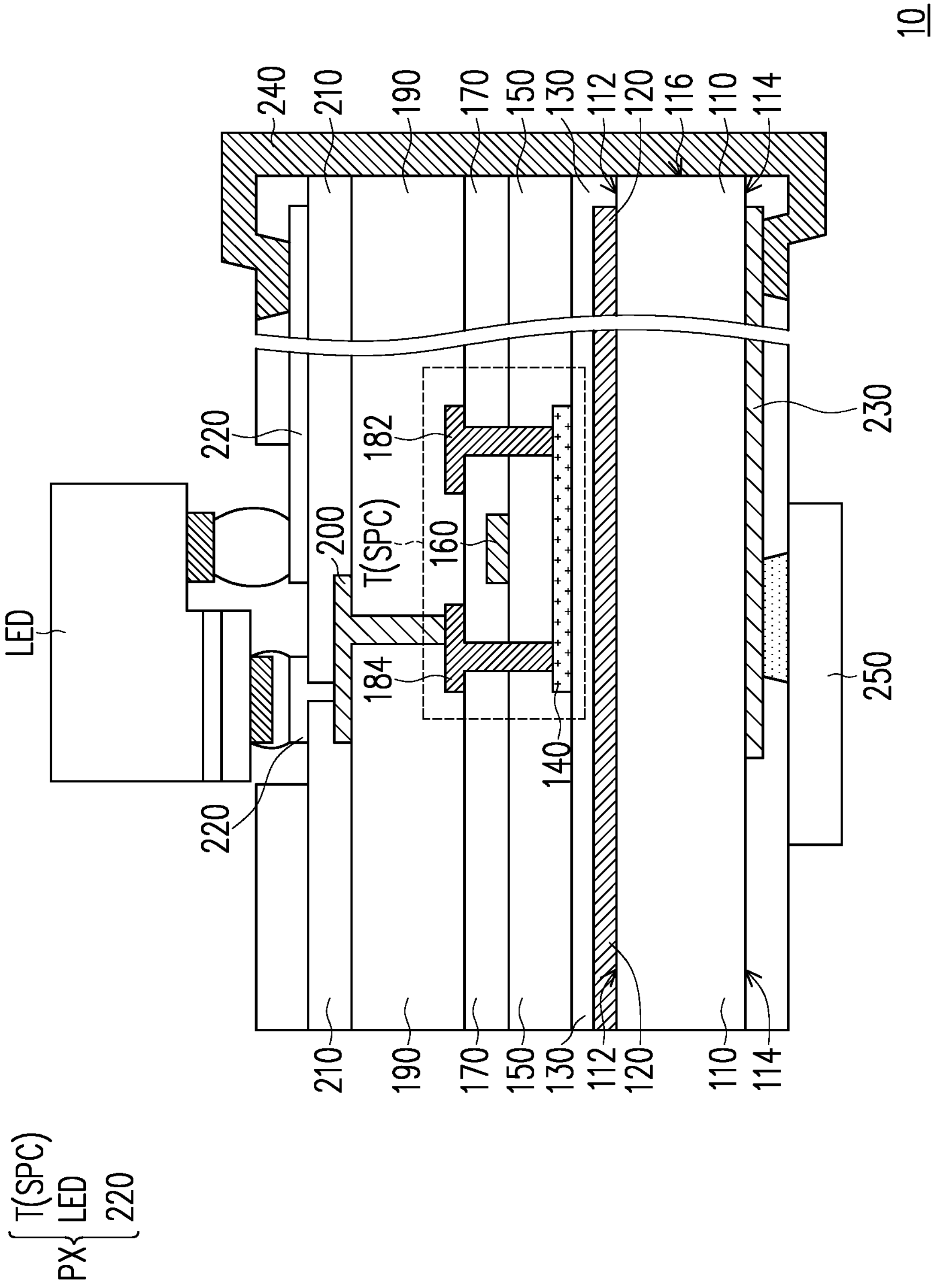
FIG. 1 is a schematic cross-sectional view of a display apparatus according to an embodiment of the disclosure.

Reference will now be made in detail to the exemplary embodiments of the disclosure, and examples of the exemplary embodiments are illustrated in the accompanying drawings. Wherever possible, the same reference numerals are used in the drawings and descriptions to refer to the same or similar parts.

It will be understood that when a component such as a layer, a film, a region, or a substrate is referred to as being "on" or "connected to" another component, the component may be directly on or connected to the other component, or intermediate components may be present thereon. In contrast, when a component is referred to be "directly on" or "directly connected to" another component, none other intermediate component exists therebetween. As used herein, "connection" may refer to physical and/or electrical connection. Furthermore, "electrical connection" or "coupling" may mean that other components exist between the two components.

Considering the discussed measurement and a specific number of errors associated with the measurement (i.e., limitations of the measurement system), the terms "about," "approximately," or "substantially" used herein includes include the stated value and an average within an acceptable deviation range for a specific value determined by those skilled in the art. For example, "about" may represent a range within one or more standard deviations of the stated value, or within ±30%, ±20%, ±10%, ±5%. Furthermore, "about", "approximately," or "substantially" used herein may select a more acceptable deviation range or standard deviation according to optical properties, etching properties, or other properties, and not one standard deviation may be applied to all properties.

Unless otherwise defined, all terms (including technical and scientific terms) used herein have the same meaning as commonly understood by persons of ordinary skill in the art to which the disclosure belongs. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

FIG. 1 is a schematic cross-sectional view of a display apparatus according to an embodiment of the disclosure. Referring to FIG. 1, a display apparatus 10 includes a substrate 110 having a first surface 112, a second surface 114, and a side surface 116. The first surface 112 and the second surface 114 are opposite to each other, and the side surface 116 is connected between the first surface 112 and the second surface 114. For example, in the embodiment, the material of the substrate 110 may be glass, quartz, organic polymer, opaque/reflective material (for example: wafer, ceramic, or other applicable materials) or other materials, but the disclosure is not limited thereto.

The display apparatus 10 further includes multiple pixel structures PX disposed on the first surface 112 of the substrate 110. In the embodiment, each pixel structure PX may include a pixel driving circuit SPC and a light emitting component LED electrically connected to the pixel driving circuit SPC. The pixel driving circuit SPC may include a thin film transistor T, and the light emitting component LED is electrically connected to the thin film transistor T. In the embodiment, each pixel structure PX may further include multiple pads 220. The multiple pads 220 are electrically connected to the pixel driving circuit SPC, and the light emitting component LED is bonded to the pad 220. In the embodiment, the light emitting component LED is, for example, a micro LED, but the disclosure is not limited thereto.

In the embodiment, the display apparatus 10 further includes a buffer layer 130 disposed on the first surface 112 of the substrate 110. The pixel driving circuit SPC is disposed on the buffer layer 130, and the buffer layer 130 is disposed between the pixel driving circuit SPC and the first surface 112 of the substrate 110. The pixel driving circuit SPC includes the thin film transistor T disposed on the buffer layer 130, and the buffer layer 130 is disposed between the thin film transistor T and the first surface 112 of the substrate 110.

The thin film transistor T has a semiconductor pattern 140, a gate 160, a gate insulating layer 150 disposed between the gate 160 and the semiconductor pattern 140, and a source 182 and a drain 184 electrically connected to two different regions of the semiconductor pattern 140 respectively. For example, in the embodiment, the semiconductor pattern 140 may be disposed on the buffer layer 130. The gate insulating layer 150 may be disposed on the semiconductor pattern 140 and the buffer layer 130. The gate 160 may be disposed on the gate insulating layer 150. A first interlayer dielectric layer 170 may be disposed on the gate 160 and the gate insulating layer 150. The source 182 and the drain 184 may be disposed on the first interlayer dielectric layer 170. In short, in the embodiment, the gate 160 may be disposed above the semiconductor pattern 140, and the thin film transistor T may be a top gate type transistor. However, the disclosure is not limited thereto. In other embodiments, the thin film transistor T may also be a bottom gate type transistor or other types of transistors.

In the embodiment, the display apparatus 10 may selectively further include a second interlayer dielectric layer 190 and a transfer pattern 200. The second interlayer dielectric layer 190 is disposed on the source 182, the drain 184, and the first interlayer dielectric layer 170, and the transfer pattern 200 is disposed on the second interlayer dielectric layer 190 and electrically connected to the drain 184. In the embodiment, the display apparatus 10 may selectively further include an insulating layer 210 disposed on the transfer pattern 200 and the second interlayer dielectric layer 190, and the multiple pads 220 may be disposed on the insulating layer 210. One of the pads 220 may be electrically connected to the thin film transistor T through the transfer pattern 200. However, the disclosure is not limited thereto. In other embodiments, the pad 220 may also be electrically connected to the thin film transistor T in other ways.

The display apparatus 10 further includes a back side signal line 230 disposed on the second surface 114 of the substrate 110 and electrically connected to the pixel structure PX. For example, in the embodiment, the display apparatus 10 further includes a front side signal line (not shown) disposed on the first surface 112 of the substrate 110. The pixel structure PX and the front side signal line are electrically connected on the first surface 112. The display apparatus 10 further includes a side connection line 240 disposed on the side 116 of the substrate 110. The front side signal line (not shown) may be connected to the back side signal line 230 disposed on the second surface 114 of the substrate 110 through the side connection line 240, whereby the pixel structure PX located on the first surface 112 may be electrically connected to the back side signal line 230 located on the second surface 114. However, the disclosure is not limited thereto. In other embodiments, the pixel structure PX and the back side signal line 230 may also be electrically connected in other ways.

In the embodiment, the display apparatus 10 may further include an electronic component 250 disposed on the second surface 114 of the substrate 110 and electrically connected to the back side signal line 230. For example, in the embodiment, the electronic component 250 may be, for example, a driver chip. However, the disclosure is not limited thereto. In other embodiments, the electronic component 250 may also be a flexible printed circuit (FPC) or other types of electronic components.

In the embodiment, the display apparatus 10 further includes a conductive shielding layer 120 disposed between the pixel structure PX and the first surface 112 of the substrate 110. In detail, in the embodiment, the conductive shielding layer 120 may be disposed between the buffer layer 130 and the first surface 112 of the substrate 110. It should be noted that the conductive shielding layer 120 has a DC level. When the voltage signal of the back side signal line 230 oscillates up and down, the conductive shielding layer 120 having the DC level may prevent the voltage signal of the back side signal line 230 from interfering with the level of the pixel structure PX, thereby improving the problem of display defects (pattern mura) described in the prior art.

For example, in the embodiment, the conductive shielding layer 120 may be grounded or electrically connected to a system high voltage terminal having a DC level. However, the disclosure is not limited thereto. In other embodiments, the conductive shielding layer 120 may also be electrically connected to other DC signal terminals of the display apparatus 10.

The material of the conductive shielding layer 120 may be any conductive material. For example, in the embodiment, the material of the conductive shielding layer 120 may include metal, alloy, nitride of metal material, oxide of metal material, oxynitride of metal material, other conductive materials, or at least two stack layers of the above.

In the embodiment, the conductive shielding layer 120 disposed on the first surface 112 may completely shield the first surface 112 of the substrate 110. However, the disclosure is not limited thereto. The conductive shielding layer 120 disposed on the first surface 112 may also partially shield the first surface 112 of the substrate 110, which will be illustrated below in conjunction with other figures.

It must be noted here that the following embodiments continue to use the referential numbers of the components and a part of the contents of the foregoing embodiments, wherein the same referential numbers are used to denote the same or similar components, and the description of the same technical content is omitted. For the description of omitted parts, reference may be made to the foregoing embodiments, and the details are not repeated here.

Figure 2:
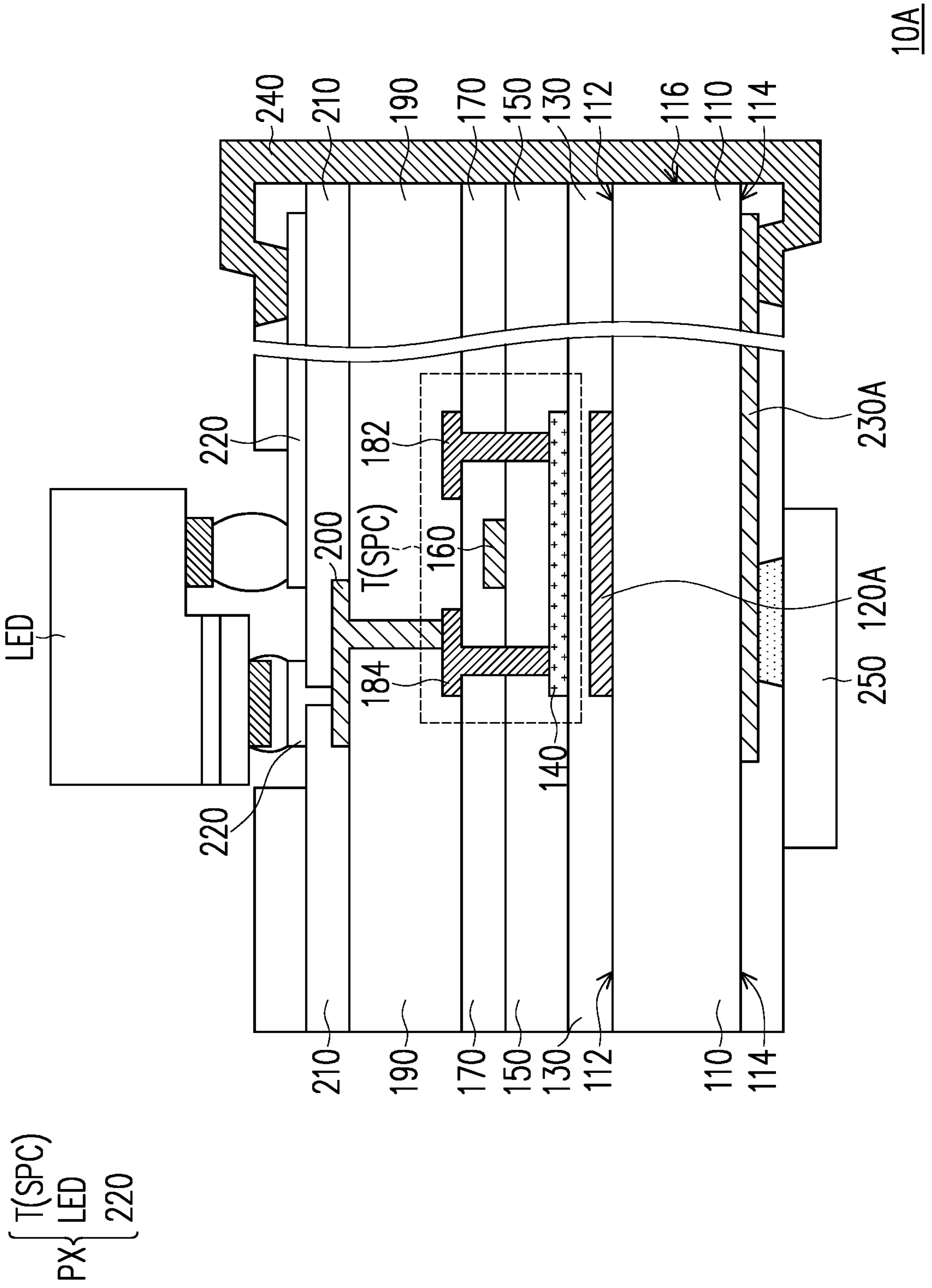
FIG. 2 is a schematic cross-sectional view of a display apparatus according to another embodiment of the disclosure.

FIG. 2 is a schematic cross-sectional view of a display apparatus according to another embodiment of the disclosure. A display apparatus 10A of FIG. 2 is similar to the display apparatus 10 of FIG. 1. The difference between the two is that the shielding range of a conductive shielding layer 120A of FIG. 2 is different from the shielding range of the conductive shielding layer 120 of FIG. 1. Referring to FIG. 2, specifically, in the embodiment, the conductive shielding layer 120A partially shields the first surface 112 of the substrate 110. In detail, in the embodiment of FIG. 2, when the light emitting component LED emits light, the gate 160 of the thin film transistor T is in a floating state. The conductive shielding layer 120A shields the gate 160 of the thin film transistor T, but does not shield other areas. That is to say, the conductive shielding layer 120A shields nodes in the pixel driving circuit SPC that are prone to level changes due to electrical coupling with the back side signal line 230, but does not shield portions in the pixel driving circuit SPC that are not prone to level changes due to electrical coupling with the back side signal line 230.

Figure 3:
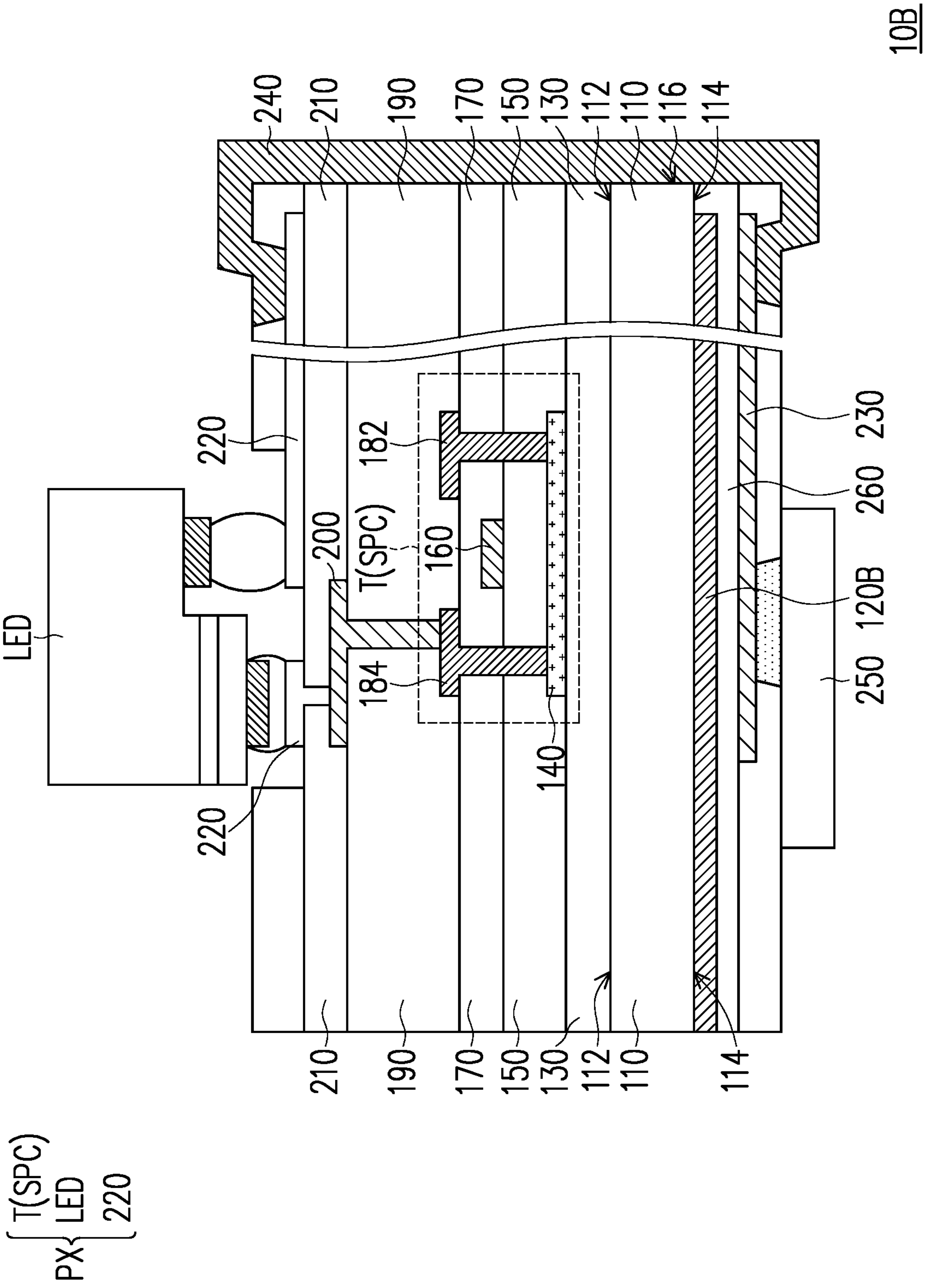
FIG. 3 is a schematic cross-sectional view of a display apparatus according to yet another embodiment of the disclosure.

FIG. 3 is a schematic cross-sectional view of a display apparatus according to yet another embodiment of the disclosure. A display apparatus 10B of FIG. 3 is similar to the display apparatus 10 of FIG. 1. The difference between the two is that a conductive shielding layer 120B of the display apparatus 10B of FIG. 3 is different from the conductive shielding layer 120 of the display apparatus 10 of FIG. 1. The conductive shielding layer 120B of FIG. 3 also has a DC level. Different from the conductive shielding layer 120 of FIG. 1, in the embodiment of FIG. 3, the conductive shielding layer 120B is disposed between the second surface 114 of the substrate 110 and the back side signal line 230. Referring to FIG. 3, in detail, in the embodiment, the display apparatus 10B further includes an insulating layer 260 disposed between the second surface 114 of the substrate 110 and the back side signal line 230. The conductive shielding layer 120B is disposed between the second surface 114 of the substrate 110 and the insulating layer 260.

In the embodiment of FIG. 3, the conductive shielding layer 120B disposed on the second surface 114 may selectively shield the entire second surface 114 of the substrate 110. However, the disclosure is not limited thereto. The conductive shielding layer 120 disposed on the second surface 114 may also partially shield the second surface 114 of the substrate 110, which will be illustrated below in conjunction with other figures.

Figure 4:
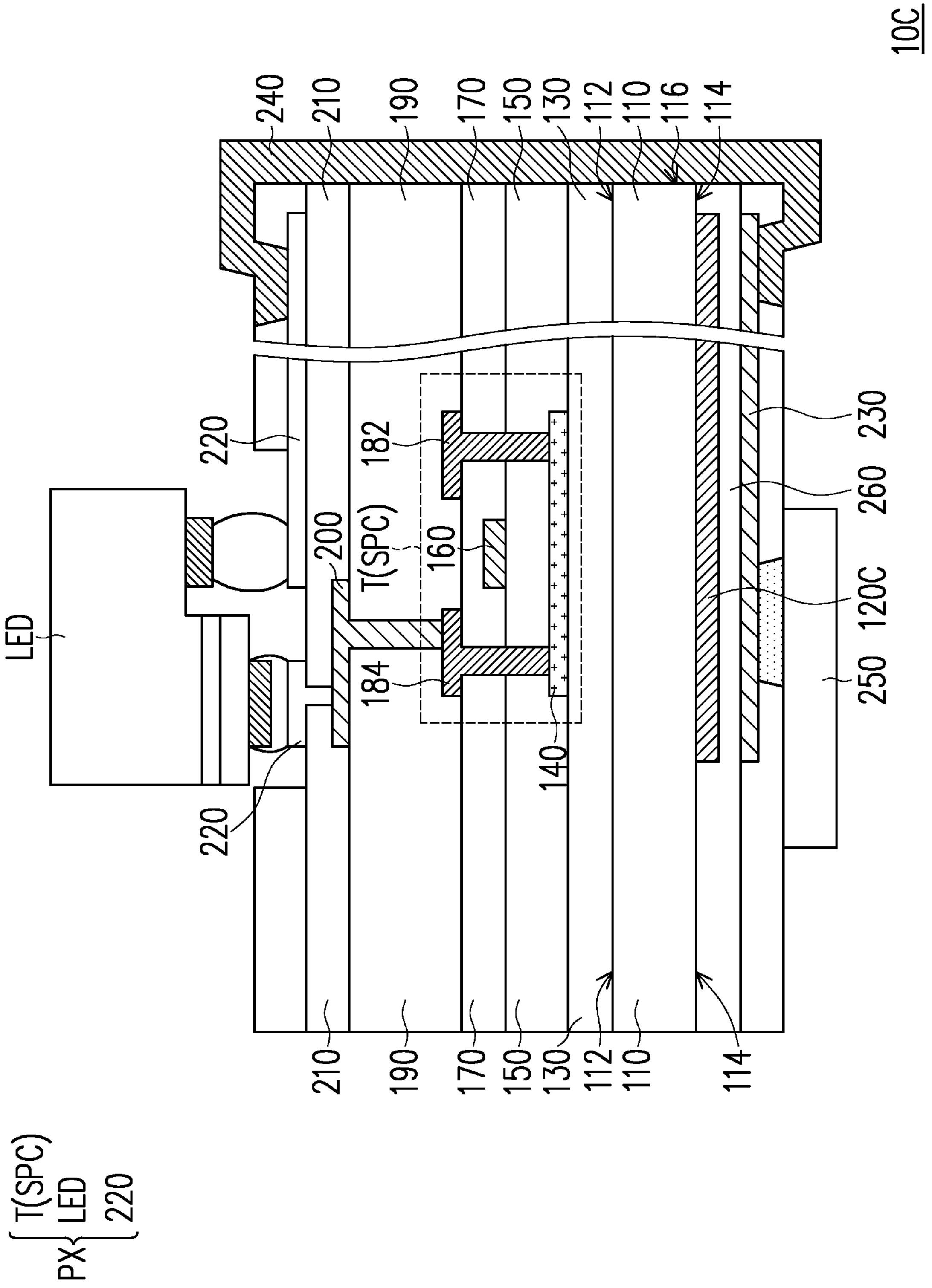
FIG. 4 is a schematic cross-sectional view of a display apparatus according to still another embodiment of the disclosure.

FIG. 4 is a schematic cross-sectional view of a display apparatus according to still another embodiment of the disclosure. A display apparatus 10C of FIG. 4 is similar to the display apparatus 10B of FIG. 3. The difference between the two is that the shielding range of a conductive shielding layer 120C of FIG. 4 is different from the shielding range of the conductive shielding layer 120B of FIG. 3. Referring to FIG. 4, in the embodiment, the conductive shielding layer 120B partially shields the second surface 114 of the substrate 110. In detail, in the embodiment of FIG. 4, the conductive shielding layer 120C shields the back side signal line 230, but does not shield the portion where the back side signal line 230 is not provided. In the embodiment of FIG. 4, the vertical projection of the conductive shielding layer 120C on the substrate 110 and the vertical projection of the back side signal line 230 on the substrate 110 may substantially overlap, but the disclosure is not limited thereto.

Figure 5:
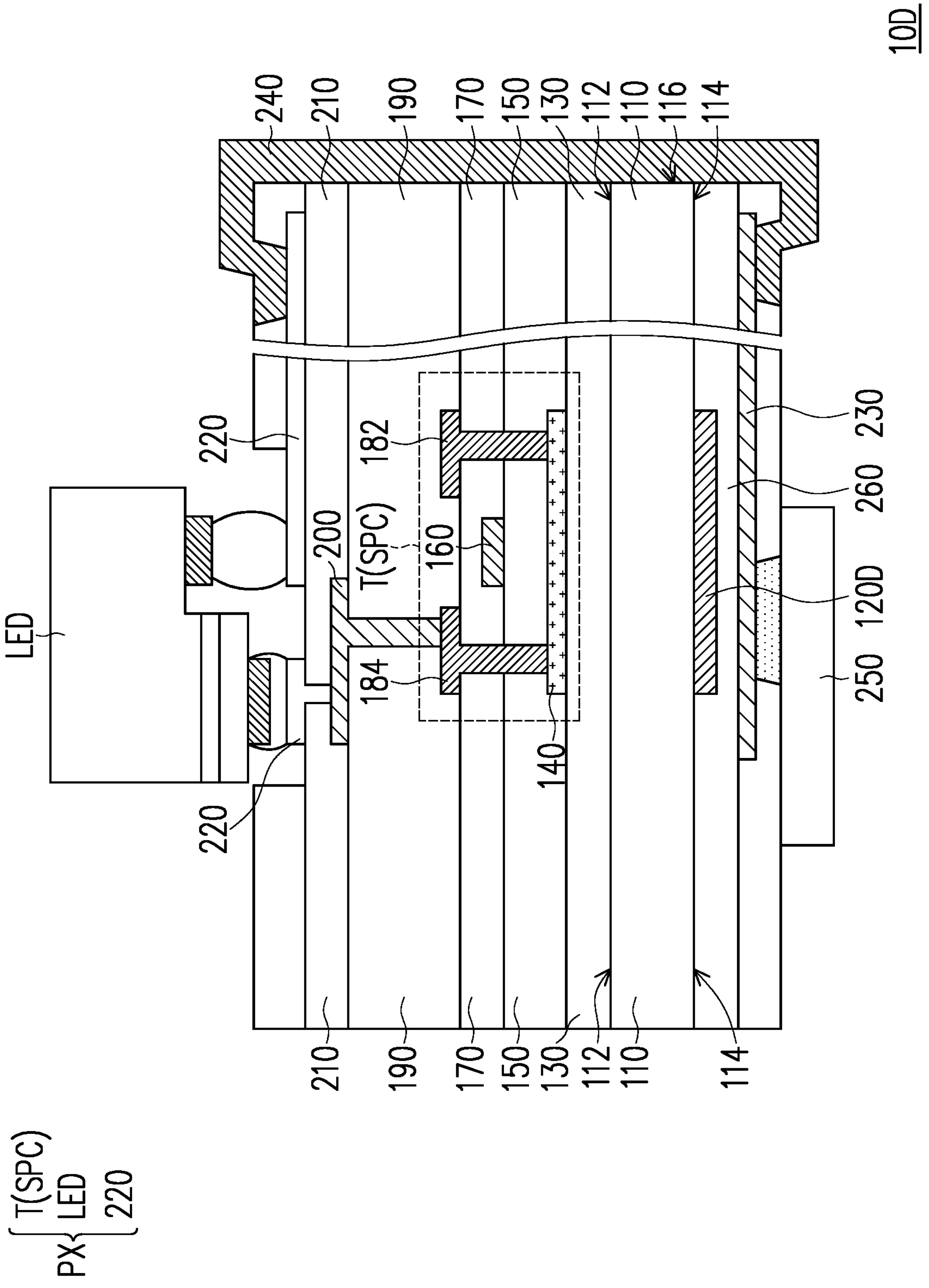
FIG. 5 is a schematic cross-sectional view of a display apparatus according to an embodiment of the disclosure.

FIG. 5 is a schematic cross-sectional view of a display apparatus according to an embodiment of the disclosure. A display apparatus 10D of FIG. 5 is similar to the display apparatus 10B of FIG. 3. The difference between the two is that the shielding range of a conductive shielding layer 120D of FIG. 5 is different from the shielding range of the conductive shielding layer 120B of FIG. 3. Referring to FIG. 5, specifically, in the embodiment, the conductive shielding layer 120D partially shields the second surface 114 of the substrate 110. In detail, in the embodiment of FIG. 5, when the light emitting component LED emits light, the gate 160 of the thin film transistor T is in a floating state. The conductive shielding layer 120D covers the gate 160 of the thin film transistor T, but does not cover other areas. That is to say, the conductive shielding layer 120D shields nodes in the pixel driving circuit SPC that are prone to level changes due to electrical coupling with the back side signal line 230, but does not shield portions in the pixel driving circuit SPC that are not prone to level changes due to electrical coupling with the back side signal line 230.

Figure 6:
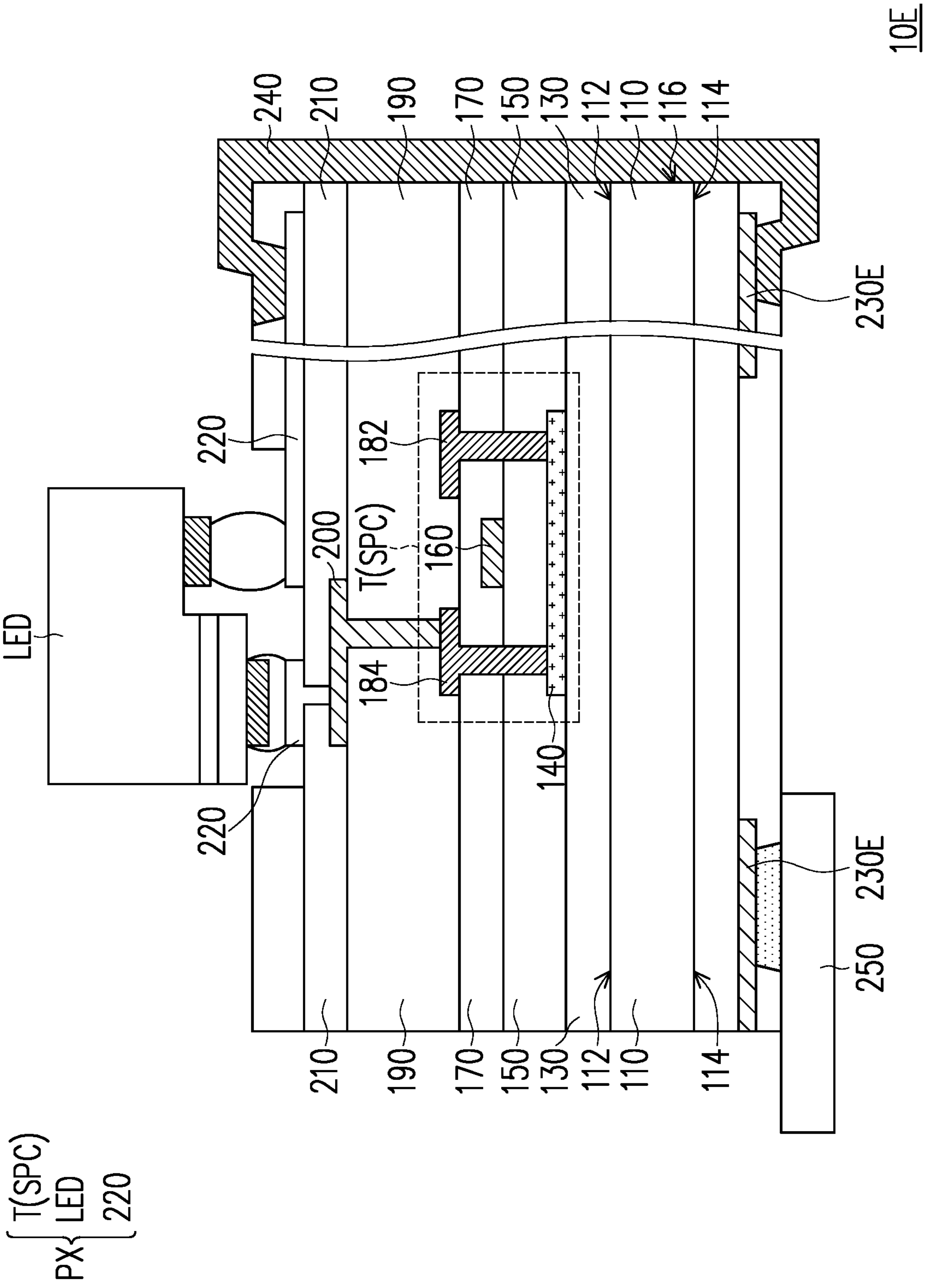
FIG. 6 is a schematic cross-sectional view of a display apparatus according to another embodiment of the disclosure.
Figure 7:
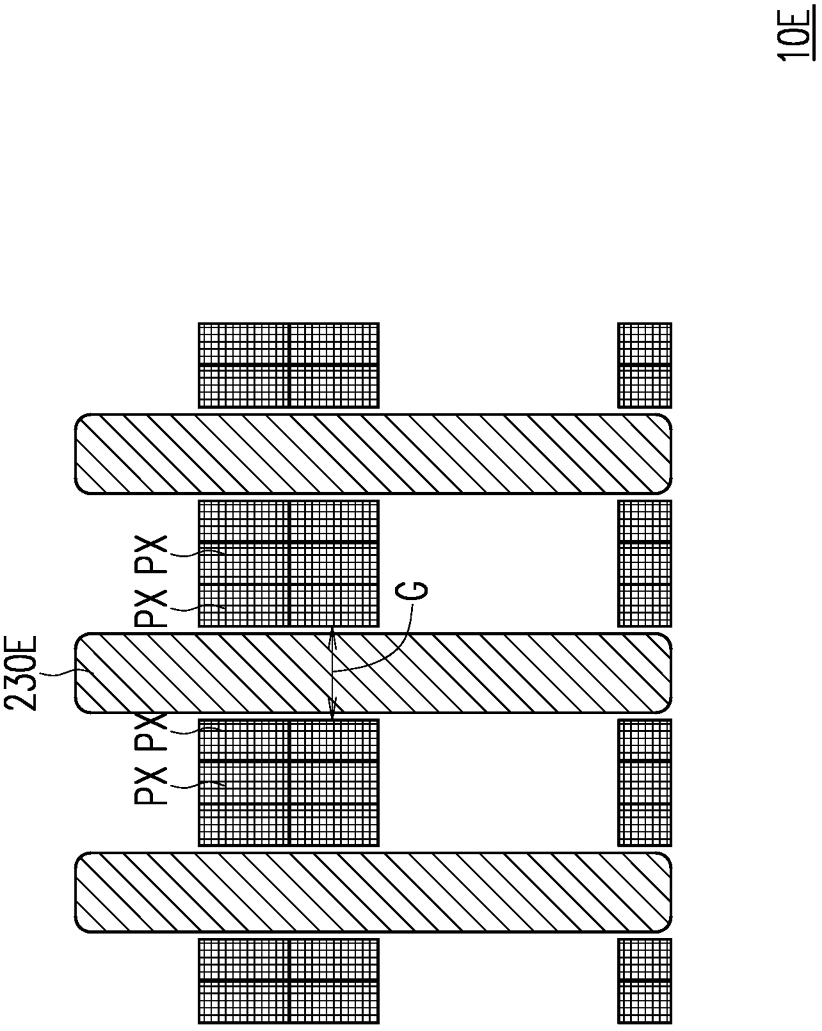
FIG. 7 is a schematic top view of a display apparatus according to another embodiment of the disclosure.

FIG. 6 is a schematic cross-sectional view of a display apparatus according to another embodiment of the disclosure. FIG. 7 is a schematic top view of a display apparatus according to another embodiment of the disclosure. FIG. 7 schematically shows the pixel structure PX and the back side signal line 230 of a display apparatus 10E, while omitting other components of the display apparatus 10E.

The display apparatus 10E of FIG. 6 and FIG. 7 is similar to the display apparatus 10 of FIG. 1. The difference between the two is that the display apparatus 10E of FIG. 6 and FIG. 7 may not include the conductive shielding layer 120 of the display apparatus 10 of FIG. 1, and the position of a back side signal line 230E of FIG. 6 and FIG. 7 is different from the position of the back side signal line 230 of FIG. 1. Referring to FIG. 6 and FIG. 7, specifically, in the embodiment, in the top view of the display apparatus 10E, there are gaps G between the multiple pixel structures PX, and the back side signal line 230E overlaps the gaps between the multiple pixel structures PX and is staggered from the multiple pixel structures PX. The disposition area of the back side signal line 230E does not overlap the area of the first surface 112 where the pixel structure PX is provided. In this way, the signal of the back side signal line 230E is not likely to interfere with the level of the pixel structure PX, thereby improving the problem of display defects (pattern mura) described in the prior art.

Figure 8:
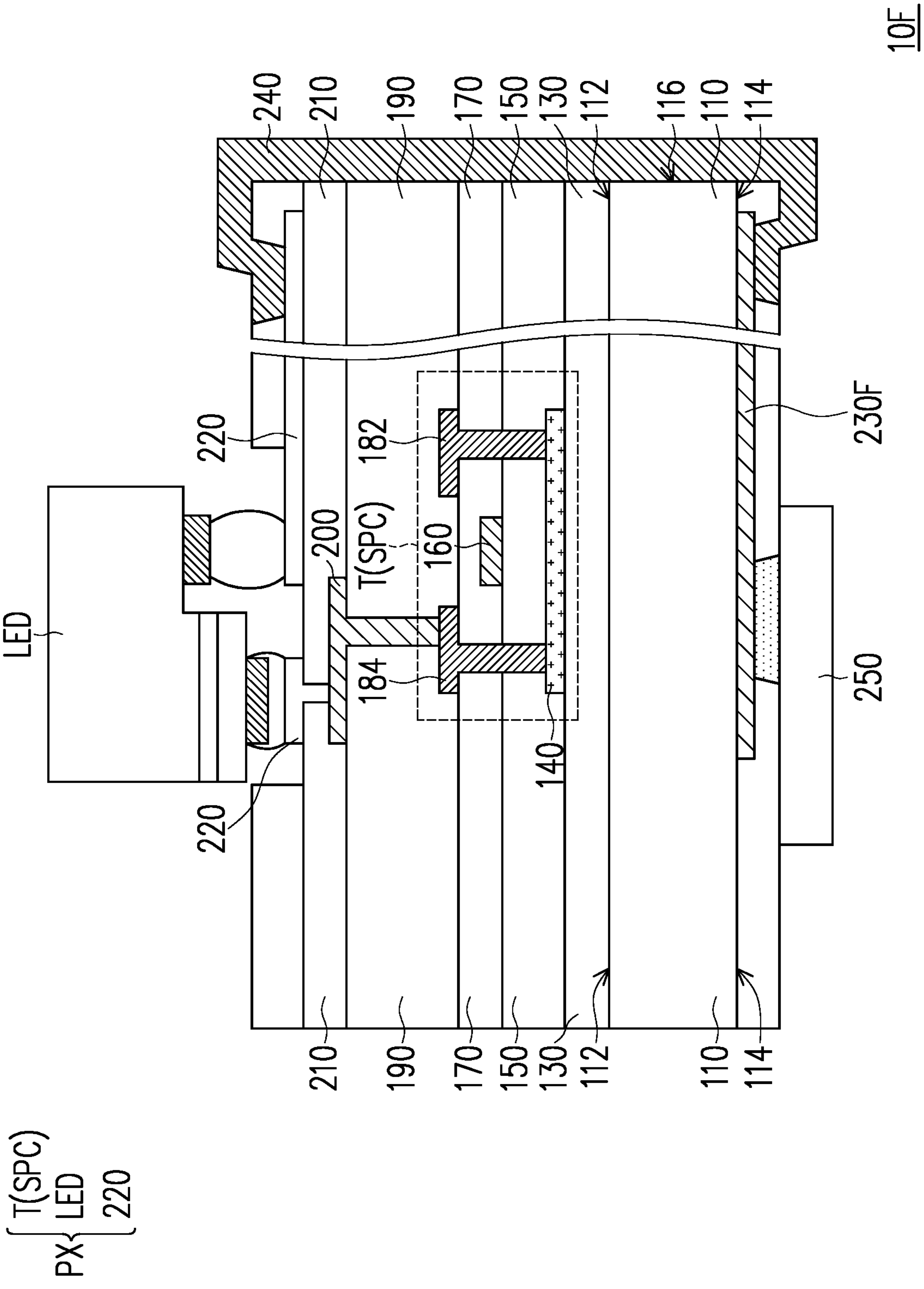
FIG. 8 is a schematic cross-sectional view of a display apparatus according to yet another embodiment of the disclosure.
Figure 9:
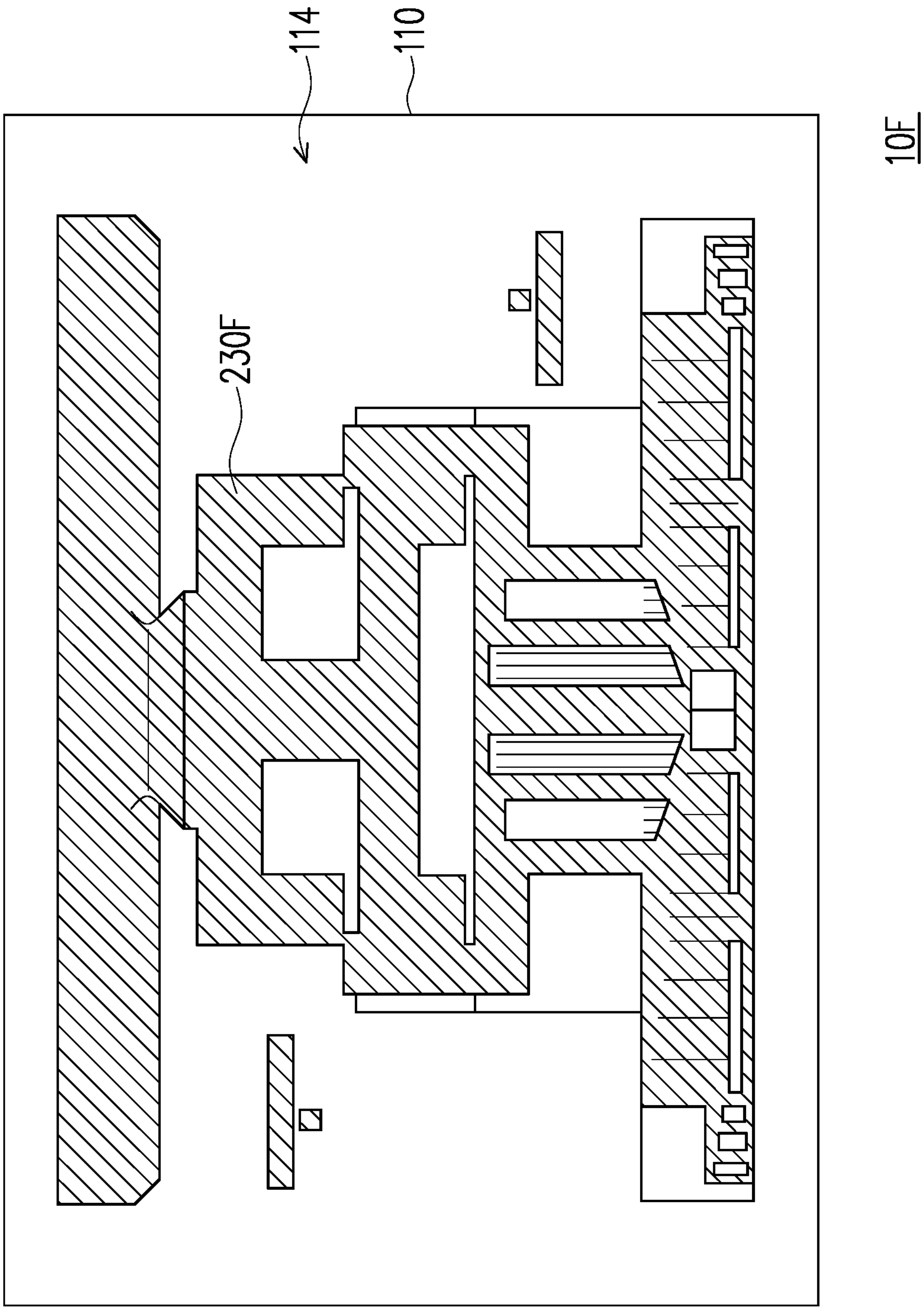
FIG. 9 is a schematic bottom view of a display apparatus according to yet another embodiment of the disclosure.

FIG. 8 is a schematic cross-sectional view of a display apparatus according to yet another embodiment of the disclosure. FIG. 9 is a schematic bottom view of a display apparatus according to yet another embodiment of the disclosure. FIG. 9 schematically shows the substrate 110 and a back side signal line 230F of a display apparatus 10F, while omitting other components of the display apparatus 10F.

The display apparatus 10F of FIG. 8 and FIG. 9 is similar to the display apparatus 10 of FIG. 1. The difference between the two is that all the back side signal lines 230F of the display apparatus 10F of FIG. 8 and FIG. 9 have a DC level. That is to say, all the conductive lines disposed on the second surface 114 of the substrate 110 have a DC level. Thereby, the conductive lines disposed on the second surface 114 of the substrate 110 are less likely to interfere with the level of the pixel structure PX, thereby improving the problem of display defects (pattern mura) described in the prior art.

What is claimed is:

1. A display apparatus, comprising:

a substrate, having a side surface, and a first surface and a second surface opposite to each other, wherein the side surface is connected between the first surface and the second surface;

a pixel structure including a pixel driving circuit, a light emitting component and a plurality of pads, disposed on the first surface of the substrate, wherein the light emitting component is bonded to the pads, the pixel driving circuit includes a thin film transistor, and the light emitting component is electrically connected to the thin film transistor through a transfer pattern and one of the pads;

a side connection line at least disposed on the side surface of the substrate;

a back side signal line, disposed on the second surface of the substrate, and electrically connected to the light emitting component of the pixel structure through the side connection line and another one of the pads; and a conductive shielding layer, disposed between the second surface of the substrate and the back side signal line, and having a DC level.

2. The display apparatus according to claim 1, further comprising:

an insulating layer, disposed between the second surface of the substrate and the back side signal line, wherein the conductive shielding layer is disposed between the second surface of the substrate and the insulating layer.

3. The display apparatus according to claim 1, wherein the conductive shielding layer is grounded or electrically connected to a system high voltage terminal.

4. The display apparatus according to claim 1, wherein the conductive shielding layer shields the second surface of the substrate.

5. The display apparatus according to claim 1, wherein the conductive shielding layer shields the back side signal line.

6. The display apparatus according to claim 1, wherein the conductive shielding layer shields a gate of the thin film transistor.

7. The display apparatus according to claim 6, wherein the gate of the thin film transistor shielded by the conductive shielding layer is in a floating state when the light emitting component emits light.

8. The display apparatus according to claim 1, wherein a portion of the side connection line directly contacts the another one of the pads, and another portion of the side connection line directly contacts the back side signal line.

9. A display apparatus, comprising:

a substrate, having a side surface, and a first surface and a second surface opposite to each other;

a pixel structure including a pixel driving circuit, a light emitting component and a plurality of pads, disposed on the first surface of the substrate, wherein the light emitting component is bonded to the pads, the pixel driving circuit includes a thin film transistor, and the light emitting component is electrically connected to the thin film transistor through a transfer pattern and one of the pads;

a side connection line at least disposed on the side surface of the substrate;

a back side signal line, disposed on the second surface of the substrate, and electrically connected to the light emitting component of the pixel structure through the side connection line and another one of the pads; and a conductive shielding layer, located between the pixel structure and the back side signal line, and having a DC level.

10. The display apparatus according to claim 9, further comprises:

a buffer layer, disposed between the thin film transistor and the first surface of the substrate, wherein the conductive shielding layer is disposed between the buffer layer and the first surface of the substrate.

11. The display apparatus according to claim 9, wherein the conductive shielding layer is grounded or electrically connected to a system high voltage terminal.

12. The display apparatus according to claim 9, wherein the conductive shielding layer completely shields the first surface of the substrate.

13. The display apparatus according to claim 9, wherein the conductive shielding layer shields a gate of the thin film transistor.

14. The display apparatus according to claim 13, wherein the gate of the thin film transistor shielded by the conductive shielding layer is in a floating state when the light emitting component emits light.

15. The display apparatus according to claim 9, wherein a portion of the side connection line directly contacts the another one of the pads, and another portion of the side connection line directly contacts the back side signal line.

* * * * *